US012796391B2

(12) United States Patent
Takada et al.

(10) Patent No.: US 12,796,391 B2
(45) Date of Patent: Nov. 10, 2026

(54) SUBSTRATE FIXING DEVICE

(71) Applicant: SHINKO ELECTRIC INDUSTRIES CO., LTD., Nagano (JP)

(72) Inventors: Kazuya Takada, Nagano (JP); Haruki Horiuchi, Nagano (JP); Shigeki Mori, Nagano (JP); Norio Shiraiwa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 19/174,527

(22) Filed: Apr. 9, 2025

(65) Prior Publication Data

US 2025/0323025 A1 Oct. 16, 2025

(30) Foreign Application Priority Data

Apr. 12, 2024 (JP) ................................ 2024-064885

(51) Int. Cl.

*H10P 72/72* (2026.01)
*C23C 16/458* (2006.01)
*H01J 37/32* (2006.01)

(52) U.S. Cl.

CPC ........ *H10P 72/722* (2026.01); *C23C 16/4586* (2013.01); *H01J 37/32715* (2013.01); *H01J 2237/2007* (2013.01)

(58) Field of Classification Search

CPC ......... H01L 21/28026; H01L 21/28158; H01L 21/6833; H01L 21/68785; H10P 72/722;
(Continued)

(56) References Cited

U.S. PATENT DOCUMENTS 6,256,187 B1 * 7/2001 Matsunaga ............... C08L 9/02
429/208
9,631,128 B2 * 4/2017 Fujii ...................... C09J 183/04
(Continued)

FOREIGN PATENT DOCUMENTS

CN 114388400 A * 4/2022 ............... H05B 3/02
JP H0964160 A * 3/1997
(Continued)

*Primary Examiner* — Sunil K Singh
*Assistant Examiner* — Michael Vitale
(74) *Attorney, Agent, or Firm* — Rankin, Hill & Clark LLP

(57) ABSTRACT

A substrate fixing device includes a base plate, an electrostatic chuck fixed on the base plate, a first through hole penetrating the base plate in a thickness direction, a recess provided in a lower surface of the electrostatic chuck and communicating with the first through hole, an electrode built in the electrostatic chuck, a power supply terminal inserted into the first through hole and electrically connected to the electrode exposed from the recess, and a tubular insulating member inserted into the first through hole and surrounding an outer periphery of the power supply terminal. The tubular insulating member is formed to surround an entire outer peripheral surface of a portion of the power supply terminal disposed inside the first through hole. The tubular insulating member is formed to extend over an entire length of the first through hole in an axial direction. The tubular insulating member is a single member.

7 Claims, 9 Drawing Sheets

(58) Field of Classification Search
CPC ........ H01J 37/32715; H01J 2237/2007; C23C 45/4586
USPC .......................................................... 361/234
See application file for complete search history.

(56) References Cited

U.S. PATENT DOCUMENTS

| | | | | |
|---|---|---|---|---|
| 10,256,131 | B2 * | 4/2019 | Kosakai | H01L 21/67109 |
| 11,658,015 | B2 * | 5/2023 | Minemura | H01J 37/32724 361/234 |
| 11,887,877 | B2 * | 1/2024 | Kosakai | H02N 13/00 |
| 2010/0002354 | A1 * | 1/2010 | Inazumachi | H02N 13/00 361/234 |
| 2015/0077895 | A1 * | 3/2015 | Jindo | C04B 35/645 228/121 |
| 2015/0348814 | A1 * | 12/2015 | Shiraiwa | H01L 21/6833 361/234 |
| 2017/0323819 | A1 * | 11/2017 | Kosakai | H01L 21/67103 |
| 2018/0040497 | A1 * | 2/2018 | Harayama | H02N 13/00 |
| 2018/0076067 | A1 * | 3/2018 | Kitabayashi | H01L 21/68785 |
| 2021/0242053 | A1 * | 8/2021 | Matsushita | H01L 21/67103 |
| 2023/0060253 | A1 | 3/2023 | Oguro et al. | |
| 2023/0170191 | A1 * | 6/2023 | Inoue | H01J 37/32715 361/234 |
| 2023/0223245 | A1 * | 7/2023 | Takebayashi | H01J 37/32724 361/234 |

FOREIGN PATENT DOCUMENTS

| | | | | | |
|---|---|---|---|---|---|
| JP | 5501467 | B2 | * | 5/2014 | H01L 21/683 |
| JP | WO2013162000 | A1 | * | 12/2015 | C23C 16/46 |
| JP | 6278277 | B2 | * | 2/2018 | H01L 21/6833 |
| JP | 6475031 | B2 | * | 2/2019 | |
| JP | 6704821 | B2 | * | 6/2020 | H01L 21/6833 |
| JP | 2023-31603 | A | | 3/2023 | |
| WO | WO-2010030101 | A2 | * | 3/2010 | H01L 21/6833 |

* cited by examiner

SUBSTRATE FIXING DEVICE

TECHNICAL FIELD

The present invention relates to a substrate fixing device.

BACKGROUND ART

In the related art, film formation devices (for example, CVD devices and PVD devices) and plasma etching devices used in manufacturing semiconductor devices such as an IC and an LSI have a substrate fixing device for precisely holding a substrate such as a silicon wafer within a vacuum processing chamber.

The substrate fixing device includes a base plate made of metal, an electrostatic chuck bonded onto the base plate, an electrode incorporated in the electrostatic chuck, a power supply terminal electrically connected to the electrode, and a tubular insulating member (see, for example, JP2023-31603A). The substrate fixing device includes a through hole penetrating the base plate in a thickness direction and a recess provided on a lower surface of the electrostatic chuck and exposing the electrode. The power supply terminal is inserted into the through hole and bonded to the electrode exposed from the recess. When a voltage is applied from an external power supply through the power supply terminal, the electrode generates an attraction force by static electricity between the electrode and the substrate mounted on a mounting surface of the electrostatic chuck.

Accordingly, the substrate can be attracted and held on the mounting surface of the electrostatic chuck. The tubular insulating member is inserted into the through hole and surrounds an outer periphery of the power supply terminal. The tubular insulating member enhances an electrical insulating property between the base plate and the power supply terminal to prevent occurrence of discharge between the base plate and the power supply terminal.

SUMMARY OF INVENTION

In the substrate fixing device, it is desired to further prevent the occurrence of discharge.

According to one aspect of the present disclosure, there is provided a substrate fixing device includes a base plate, an electrostatic chuck fixed on the base plate, a first through hole penetrating the base plate in a thickness direction, a recess provided in a lower surface of the electrostatic chuck and communicating with the first through hole, an electrode built in the electrostatic chuck, a power supply terminal inserted into the first through hole and electrically connected to the electrode exposed from the recess, and a tubular insulating member inserted into the first through hole and surrounding an outer periphery of the power supply terminal. The tubular insulating member is formed to surround an entire outer peripheral surface of a portion of the power supply terminal disposed inside the first through hole. The tubular insulating member is formed to extend over an entire length of the first through hole in an axial direction. The tubular insulating member is a single member.

According to one aspect of the present invention, an effect is achieved in that the occurrence of discharge can be prevented.

DESCRIPTION OF EMBODIMENTS

Figure 1:
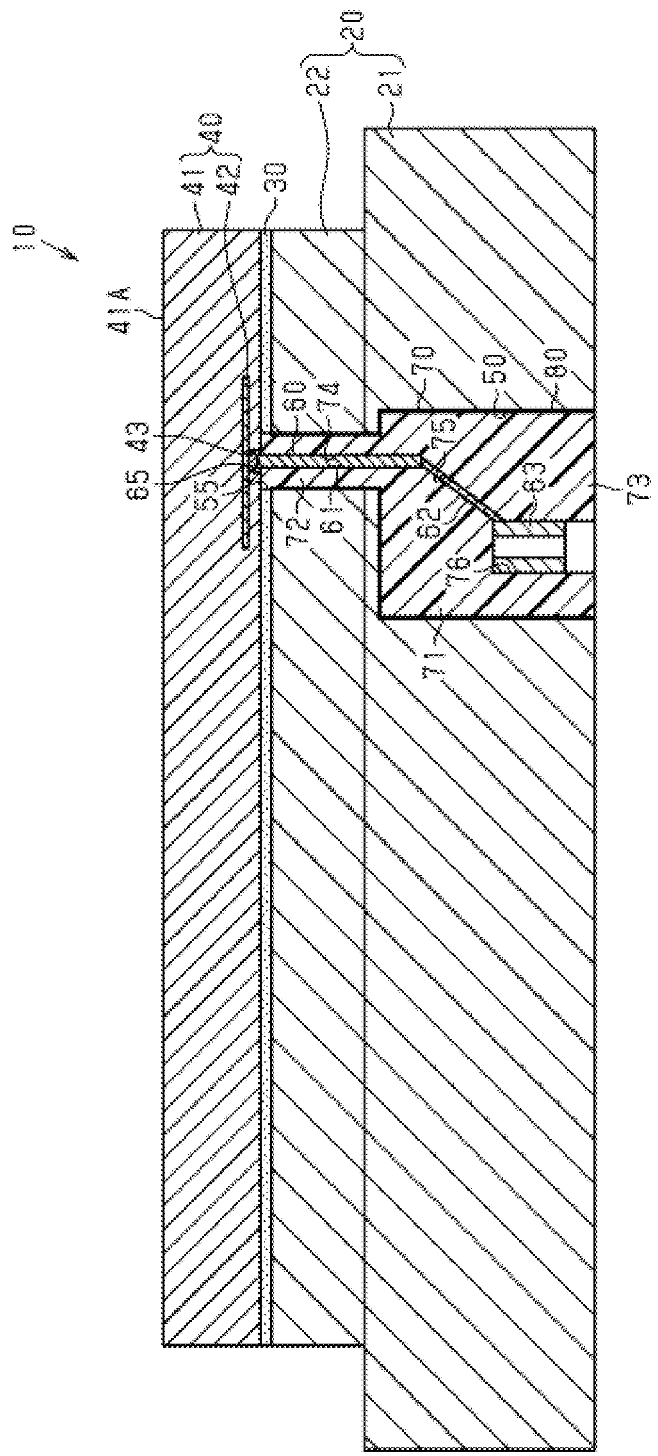
FIG. 1 is a schematic sectional view showing a substrate fixing device according to an embodiment.

Hereinafter, an embodiment will be described with reference to the accompanying drawings.

In addition, in the accompanying drawings, for the sake of convenience, a portion serving as characteristics may be shown in an enlarged manner in order to facilitate understanding of the characteristics, and a dimensional ratio of each component may be different in each drawing. In the sectional views, in order to facilitate understanding of a sectional structure of each member, hatching of some members is shown instead of a satin pattern, and hatching of some members is omitted. In the present specification, a term “plan view” refers to viewing an object from a vertical direction in FIG. 1 (upper-lower direction in the drawing) unless otherwise specified. In the present specification, a “planar shape” refers to a shape of an object viewed from the vertical direction in FIG. 1, unless otherwise specified. The “upper-lower direction” and the “left-right direction” in the present specification are directions in a case where a direction in which a reference sign indicating each member is correctly readable in each drawing is a positive position.

Overall Configuration of Substrate Fixing Device 10

As shown in FIG. 1, a substrate fixing device 10 includes a base plate 20, an adhesive layer 30, an electrostatic chuck 40, through holes 50, 55, a power supply terminal 60, a tubular insulating member 70, and an insulating film 80. The electrostatic chuck 40 is fixed to an upper surface of the base plate 20 by the adhesive layer 30. The substrate fixing device 10 is a device that attracts and holds a substrate (not shown), which is an object to be attracted, by the electrostatic chuck 40 fixed to the upper surface of the base plate 20. Examples of the substrate include a silicon wafer, and the like. A diameter of the substrate can be, for example, about 8 inches, 12 inches, or 18 inches.

Configuration of Base Plate 20

The base plate 20 is a base (base) on which the electrostatic chuck 40 is mounted. The base plate 20 has rigidity for supporting the electrostatic chuck 40. A thickness of the base plate 20 can be, for example, approximately 20 mm to 50 mm. As a material of the base plate 20, for example, a metal material such as aluminum or cemented carbide, a composite material of the metal material and a ceramic material, or the like can be used. The material of the base plate 20 according to the present embodiment is an aluminum alloy.

The base plate 20 includes a lower portion 21 and an upper portion 22 laminated on an upper surface of the lower portion 21. The lower portion 21 is formed in a disk shape, for example. The upper portion 22 is formed in a disk shape, for example. For example, the upper portion 22 is concentrically disposed on the upper surface of the lower portion 21. The upper portion 22 has a size smaller than that of the lower portion 21 in a plan view. A diameter of the upper portion 22 is smaller than a diameter of the lower portion 21. The upper portion 22 protrudes upward from the upper surface of the lower portion 21.

Although not shown, a cooling path through which a cooling medium for cooling the substrate attracted onto the electrostatic chuck 40 is circulated, a gas path for introducing inert gas for cooling the substrate attracted onto the electrostatic chuck 40, and the like are provided inside the base plate 20.

Configuration of Adhesive Layer 30

The adhesive layer 30 is provided between the base plate 20 and the electrostatic chuck 40. The adhesive layer 30 bonds the base plate 20 and the electrostatic chuck 40. The adhesive layer 30 covers, for example, the upper surface of the base plate 20, specifically, the entire upper surface of the upper portion 22. The adhesive layer 30 covers, for example, the entire lower surface of the electrostatic chuck 40.

As the adhesive layer 30, for example, an adhesive made of a polymer compound can be used. As the adhesive layer 30, for example, a silicone adhesive can be used. The adhesive layer 30 functions as, for example, an adhesive for bonding the base plate 20 and the electrostatic chuck 40, and also functions as a heat conduction member for conducting the heat of the electrostatic chuck 40 to the base plate 20. As the material of the adhesive layer 30, for example, a material having high thermal conductivity can be used. A thickness of the adhesive layer 30 can be, for example, 0.05 mm to 2.0 mm.

Configuration of Electrostatic Chuck 40

The electrostatic chuck 40 includes a substrate body 41 and an electrode 42 built in the substrate body 41. The electrostatic chuck 40 is, for example, a Johnsen-Rahbek type electrostatic chuck. However, the electrostatic chuck 40 may be a Coulomb force type electrostatic chuck. The electrostatic chuck 40 is a holder that attracts and holds the substrate which is an object to be attracted.

The substrate body 41 is formed in a disk shape, for example. For example, a diameter of the substrate body 41 may be equal to the diameter of the upper portion 22 of the base plate 20 or may be larger than the diameter of the upper portion 22. The diameter of the substrate body 41 according to the present embodiment is equal to the diameter of the upper portion 22. The diameter of the substrate body 41 may be, for example, about 150 mm to 500 mm. A thickness of the substrate body 41 may be, for example, about 0.5 mm to 10 mm. A material having an insulating property can be used as the material of the substrate body 41. As a material of the substrate body 41, a ceramic material such as aluminum oxide, aluminum nitride, or silicon nitride, or an organic material such as a silicone resin or a polyimide resin can be used. The material of the substrate body 41 according to the present embodiment is a ceramic material containing aluminum oxide as a main component. Here, the "main component" in the specification refers to a component that occupies 90% by weight or more of the components contained in a target site. Here, in the substrate body 41, a purity of aluminum oxide is preferably 95% or more, and the purity of aluminum oxide is more preferably 99.5% or more. By configuring the substrate body 41 with the high-purity aluminum oxide as described above, temperature dependence of an insulation resistance in the electrostatic chuck 40 can be reduced, and the decrease in the insulation resistance with respect to temperature rise can be prevented. The purity of 99.5% or more indicates that the substrate body is formed without adding a sintering aid. In addition, the purity of 99.5% or more means that unintended impurities may be contained in manufacturing processes or the like.

The substrate body 41 has a mounting surface 41A (here, an upper surface) on which a substrate as an object to be attracted is mounted. The substrate body 41 is, for example, a dielectric. The substrate body 41 is, for example, a ceramic substrate formed by sintering a green sheet produced using aluminum oxide.

The electrode 42 is, for example, an electrostatic electrode for attracting a substrate mounted on the mounting surface 41A. The electrode 42 is an electrode formed in a thin film shape. For example, the electrode 42 is disposed on a plane parallel to the mounting surface 41A. The electrode 42 is electrically connected to, for example, a power supply for attraction provided outside the substrate fixing device 10 via the power supply terminal 60. When a predetermined voltage is applied from the power supply for attraction, the electrode 42 generates an attraction force due to static electricity between the electrode 42 and the substrate mounted on the mounting surface 41A. Thus, the substrate can be attracted and held on the mounting surface 41A. An attraction holding force of the electrostatic chuck 40 increases as the voltage applied to the electrode 42 increases. The electrode 42 may have a unipolar shape or a bipolar shape. The electrode 42 according to the present embodiment has a unipolar shape. The voltage applied from the power supply for attraction to the electrode 42 through the power supply terminal 60 is, for example, about 3000 V to 12000 V. A voltage of about 12000 V is applied to the electrode 42 according to the present embodiment. As a material of the electrode 42, for example, tungsten (W) or molybdenum (Mo) can be used. Although one electrode 42 is shown in each drawing, a plurality of electrodes arranged on the same plane are actually included. The electrode 42 may be an electrode for electrically connecting an electrostatic electrode built in the substrate body 41 and the power supply terminal 60.

Figure 2:
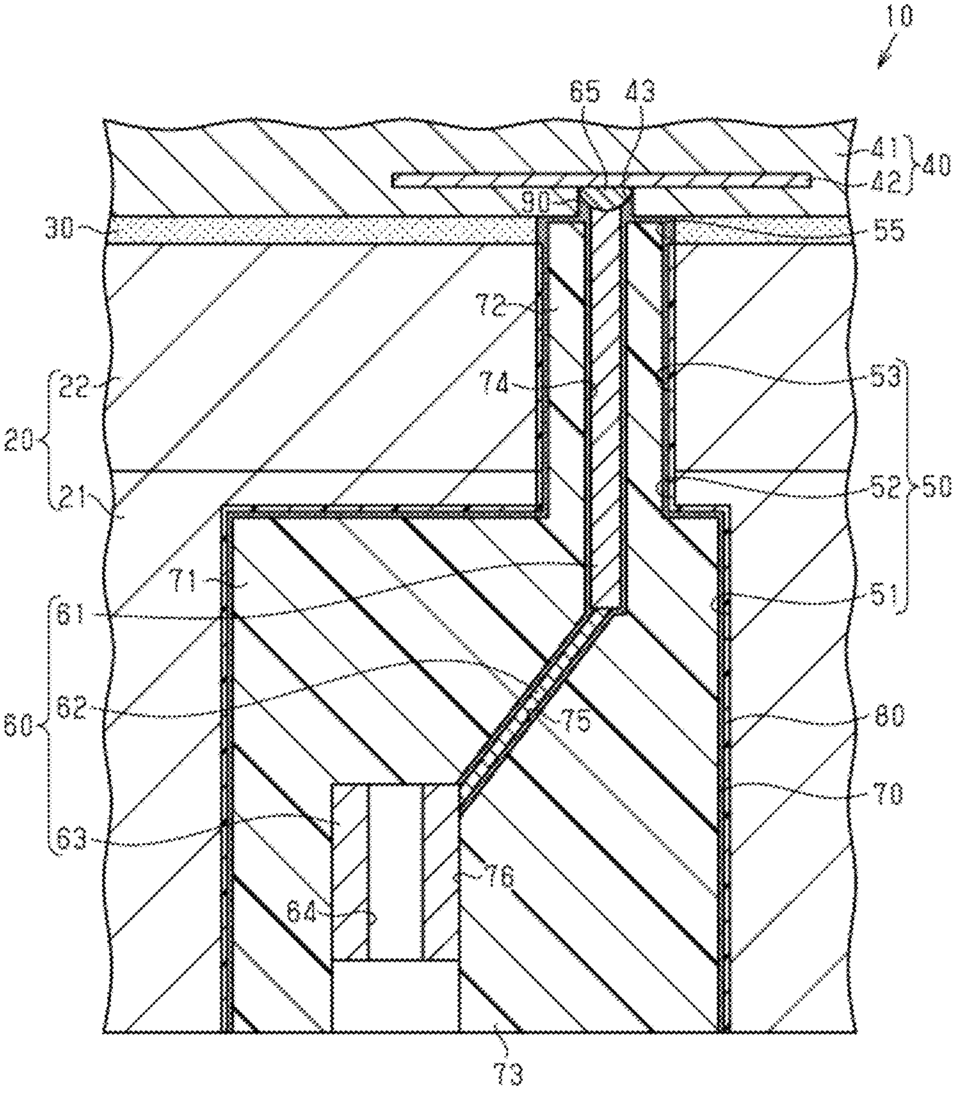
FIG. 2 is an enlarged schematic sectional view showing a part of the substrate fixing device according to the embodiment.

As shown in FIG. 2, the electrostatic chuck 40 has a recess 43 provided in a lower surface of the substrate body 41. The recess 43 is recessed upward from the lower surface of the substrate body 41. The recess 43 is formed, for example, to expose a part of the lower surface of the electrode 42. The recess 43 is formed to communicate with the through holes 50, 55. The recess 43 may have any planar shape. The planar shape of the recess 43 according to the present embodiment is formed in a circular shape.

Configuration of Through Hole 50

The through hole 50 is formed to penetrate the base plate 20 in the thickness direction. The through hole 50 includes, for example, a first recess 51 and a second recess 52 provided in the lower portion 21 of the base plate 20, and a hole portion 53 penetrating the upper portion 22 of the base plate 20 in the thickness direction. The first recess 51 and the second recess 52 are formed to penetrate the lower portion 21 in the thickness direction in cooperation with each other.

The first recess 51 is recessed upward from the lower surface of the base plate 20, specifically, the lower surface of the lower portion 21. The first recess 51 extends from the lower surface of the lower portion 21 to an intermediate position in the thickness direction of the lower portion 21. In other words, a bottom surface of the first recess 51 is provided at an intermediate position in the thickness direction of the lower portion 21. The first recess 51 is formed to open downward of the base plate 20. The first recess 51 may have any planar shape. The planar shape of the first recess 51 according to the present embodiment is formed in a circular shape.

The second recess 52 is recessed downward from the upper surface of the base plate 20, specifically, the upper surface of the lower portion 21, and is formed to communicate with the first recess 51. The second recess 52 is formed to open upward in the base plate 20. The second recess 52 may have any planar shape. The planar shape of the second recess 52 according to the present embodiment is formed in a circular shape. The second recess 52 is smaller in size than the first recess 51 in a plan view. That is, an opening area of the second recess 52 is smaller than an opening area of the first recess 51. In other words, an inner diameter of the second recess 52 is smaller than an inner diameter of the first recess 51. The second recess 52 is provided to overlap the first recess 51 in a plan view. A central axis of the second recess 52 is provided, for example, at a position shifted to a right direction in the drawing from a central axis of the first recess 51. That is, the second recess 52 is provided to be biased to the right direction in the drawing with respect to the central axis of the first recess 51 in the left-right direction in the drawing.

The hole portion 53 is formed to penetrate from the upper surface to the lower surface of the upper portion 22 of the base plate 20. The hole portion 53 is formed to communicate with the second recess 52. The hole portion 53 may have any planar shape. The planar shape of the hole portion 53 according to the present embodiment is formed in a circular shape. The hole portion 53 has the same size as the second recess 52 in a plan view. That is, an inner diameter of the hole portion 53 is the same as the inner diameter of the second recess 52. The hole portion 53 is formed to overlap the entire second recess 52 in a plan view.

Configuration of Through Hole 55

The through hole 55 is formed to penetrate the adhesive layer 30 in the thickness direction. The through hole 55 is formed to communicate with the hole portion 53. The through hole 55 is formed to communicate with the recess 43. The through hole 55 may have any planar shape. The planar shape of the through hole 55 according to the present embodiment is formed in a circular shape. The through hole 55 has the same size as the hole portion 53 in a plan view. That is, an inner diameter of the through hole 55 is the same as an inner diameter of the hole portion 53. The through hole 55 is formed to overlap the entire hole portion 53 in a plan view. The through hole 55 has a size larger than that of the recess 43 in a plan view. That is, the inner diameter of the through hole 55 is larger than an inner diameter of the recess 43. The through hole 55 is provided to overlap the entire recess 43 in a plan view. A central axis of the through hole 55 is provided at the same position as a central axis of the recess 43, for example.

Configuration of Power Supply Terminal 60

The power supply terminal 60 is inserted into the through holes 50, 55 and the recess 43. The power supply terminal 60 includes, for example, an electrode terminal 61, a coupling member 62, and a tubular conductive member 63. The coupling member 62 is formed to couple the electrode terminal 61 and the tubular conductive member 63. The electrode terminal 61, the coupling member 62, and the tubular conductive member 63 are, for example, separate components. Each of the electrode terminal 61, the coupling member 62, and the tubular conductive member 63 is made of metal. The electrode terminal 61, the coupling member 62, and the tubular conductive member 63 are electrically connected to each other.

The electrode terminal 61 is formed in, for example, a columnar shape. The electrode terminal 61 according to the present embodiment is formed in a columnar shape. An upper end portion of the electrode terminal 61 is inserted into the recess 43. An upper end portion of the electrode terminal 61 is bonded to the electrode 42 by a bonding member 65. The bonding member 65 is provided, for example, inside the recess 43. As the bonding member 65, for example, a solder material or a brazing material can be used. In other words, the upper end portion of the electrode terminal 61 is soldered or brazed to the lower surface of the electrode 42 exposed from the recess 43. The electrode terminal 61 linearly extends downward from the electrode 42, for example. The electrode terminal 61 is provided to penetrate the through hole 55. The electrode terminal 61 is formed to extend from the electrode 42 to the first recess 51 of the through hole 50, for example.

The coupling member 62 is inserted into the first recess 51 of the through hole 50. The coupling member 62 is coupled to a lower end portion of the electrode terminal 61. The coupling member 62 is coupled to the lower end portion of the electrode terminal 61 to be rotatable with respect to the electrode terminal 61. The coupling member 62 is formed in, for example, a columnar shape. The coupling member 62 extends, for example, obliquely with respect to an axial direction of the through hole 50 (here, the upper-lower direction in the drawing). The coupling member 62 extends, for example, obliquely downward (in this example, obliquely downward to the left in the drawing) from the lower end portion of the electrode terminal 61. A lower end portion of the coupling member 62 is coupled to the tubular conductive member 63. For example, the coupling member 62 is crimped to the tubular conductive member 63 by a force of screwing the tubular conductive member 63 into the tubular insulating member 70. The coupling member 62 may be bonded to the tubular conductive member 63 by a conductive resin.

The tubular conductive member 63 is inserted into the first recess 51 of the through hole 50. In the tubular conductive member 63, for example, an outer peripheral surface of the tubular conductive member 63 is connected to the lower end portion of the coupling member 62. The tubular conductive member 63 is formed in a tubular shape having a through hole 64 penetrating the tubular conductive member 63 in the thickness direction. The tubular conductive member 63 according to the present embodiment is formed in a cylindrical shape. Although not shown, a screw thread (male screw) is provided on the outer peripheral surface of the tubular conductive member 63 according to the present embodiment. The tubular conductive member 63 is provided at a position not overlapping the electrode terminal 61 in a plan view. The tubular conductive member 63 extends linearly along the upper-lower direction in the drawing, for example. The tubular conductive member 63 does not extend to the lower surface of the base plate 20. That is, the lower surface of the tubular conductive member 63 is provided above the lower surface of the base plate 20. An outer diameter of the tubular conductive member 63 is, for example, larger than an outer diameter of the electrode terminal 61 and larger than an outer diameter of the coupling member 62. The tubular conductive member 63 is electrically connected to the power supply for attraction (not shown) provided outside the substrate fixing device 10. When a voltage is supplied from the power supply for attraction to the tubular conductive member 63, the voltage is applied to the electrode 42 through the coupling member 62 and the electrode terminal 61.

Configuration of Insulating Film 80

The insulating film 80 is formed to cover an inner surface of the through hole 50. The insulating film 80 is formed to cover the entire inner surface of the through hole 50. The insulating film 80 continuously covers the entire inner surface of the first recess 51, the entire inner surface of the second recess 52, and the entire inner surface of the hole portion 53. For example, the insulating film 80 is formed to expose the inner surface of the through hole 55. As the insulating film 80, for example, an aluminum oxide film can be used. For example, when the base plate 20 is formed of aluminum or an aluminum alloy, the insulating film 80 can be formed by alumite treatment of the base plate 20 or thermal spraying of aluminum oxide to the base plate 20. A thickness of the insulating film 80 may be, for example, about 0.2 mm to 0.4 mm.

Configuration of Tubular Insulating Member 70

The tubular insulating member 70 is inserted into the through holes 50, 55. The tubular insulating member 70 is formed to be fittable into the through holes 50, 55. The tubular insulating member 70 is a single member. That is, the tubular insulating member 70 is not a component formed by combining a plurality of components. The tubular insulating member 70 is formed in a tubular shape surrounding an outer periphery of the power supply terminal 60. The tubular insulating member 70 is formed to surround the entire outer peripheral surface of a portion of the power supply terminal 60 disposed inside the through holes 50, 55. The tubular insulating member 70 is formed to extend over the entire length of the through holes 50, 55 in the axial direction. For example, the tubular insulating member 70 is formed to fill a space between an outer peripheral surface of the power supply terminal 60 and an inner peripheral surface of the through holes 50, 55.

The tubular insulating member 70 includes a first portion 71 and a second portion 72. In the tubular insulating member 70, the first portion 71 and the second portion 72 are continuously and integrally formed. As a material of the tubular insulating member 70, an organic insulator such as polyimide or an inorganic insulator such as alumina can be used. As the material of the tubular insulating member 70, a polyetherimide resin having an excellent insulating property can be suitably used. As the material of the tubular insulating member 70, a silicone resin having excellent insulating property and flexibility can be suitably used.

The first portion 71 is fitted into the first recess 51 of the through hole 50. The first portion 71 according to the present embodiment is formed in a cylindrical shape. An outer peripheral surface of the first portion 71 is formed in a shape (here, a curved surface) along the inner peripheral surface of the first recess 51. An outer diameter of the first portion 71 is, for example, slightly smaller than the inner diameter of the first recess 51. The first portion 71 extends, for example, from a lower end of the second portion 72 to the lower surface of the base plate 20. A lower end portion of the first portion 71 is, for example, formed to protrude downward from a lower surface of the tubular conductive member 63. In other words, the lower end portion of the first portion 71 includes a protruding portion 73 protruding downward from the lower surface of the tubular conductive member 63.

The second portion 72 is fitted inside the second recess 52 and the hole portion 53 of the through hole 50, and is fitted inside the through hole 55. The second portion 72 according to the present embodiment is formed in a cylindrical shape. An outer peripheral surface of the second portion 72 is formed in a shape (here, a curved surface) along the inner peripheral surfaces of the second recess 52, the hole portion 53, and the through hole 55. An outer diameter of the second portion 72 is, for example, slightly smaller than the inner diameter of the second recess 52. An outer diameter of the second portion 72 is smaller than the outer diameter of the first portion 71. The second portion 72 is provided to entirely overlap the first portion 71 in a plan view. A central axis of the second portion 72 is provided, for example, at a position shifted to the right direction in the drawing from a central axis of the first portion 71. That is, the second portion 72 is provided to be biased to the right direction in the drawing with respect to the central axis of the first portion 71 in the left-right direction in the drawing.

The tubular insulating member 70 includes, for example, a first hole portion 74 into which the electrode terminal 61 is inserted, a second hole portion 75 into which the coupling member 62 is inserted, and a third hole portion 76 into which the tubular conductive member 63 is inserted. The first hole portion 74, the second hole portion 75, and the third hole portion 76 are formed to penetrate the tubular insulating member 70 in the thickness direction in cooperation with each other.

The first hole portion 74 is formed to communicate with the recess 43. The first hole portion 74 is formed to extend downward from an upper surface of the tubular insulating member 70. An inner peripheral surface of the first hole portion 74 is formed in a shape (here, a curved surface) along an outer peripheral surface of the electrode terminal 61. An inner diameter of the first hole portion 74 is, for example, slightly larger than the outer diameter of the electrode terminal 61.

The second hole portion 75 is formed to communicate with the first hole portion 74. The second hole portion 75 extends while being inclined with respect to the axial direction (here, the upper-lower direction in the drawing) of the first hole portion 74. The second hole portion 75 extends while being inclined with respect to the axial direction of the through hole 50 (here, the upper-lower direction in the drawing). The second hole portion 75 extends, for example, obliquely downward (in this example, obliquely downward to the left in the drawing) from the lower end of the first hole portion 74. An inner peripheral surface of the second hole portion 75 is formed in a shape (here, a curved surface) along an outer peripheral surface of the coupling member 62. An inner diameter of the second hole portion 75 is, for example, slightly larger than the outer diameter of the coupling member 62.

The third hole portion 76 is formed to communicate with the second hole portion 75. The third hole portion 76 is formed to extend upward from the lower surface of the tubular insulating member 70. An inner peripheral surface of the third hole portion 76 is formed in a shape (here, a curved surface) along the outer peripheral surface of the tubular conductive member 63. An inner diameter of the third hole portion 76 is, for example, slightly larger than the outer diameter of the tubular conductive member 63. A depth of the third hole portion 76 is, for example, larger than a height of the tubular conductive member 63. The tubular conductive member 63 is fitted to an upper portion of the third hole portion 76. Although not shown, a screw groove (female screw) is provided on the inner peripheral surface of the third hole portion 76.

As described above, in the substrate fixing device 10 according to the present embodiment, the outer periphery of the power supply terminal 60 is surrounded by the single tubular insulating member 70.

Configuration of Adhesive 90

The substrate fixing device 10 includes an adhesive 90 that bonds the base plate 20 and the tubular insulating member 70. The adhesive 90 bonds the power supply terminal 60 and the tubular insulating member 70, for example. The adhesive 90 bonds the electrostatic chuck 40 and the tubular insulating member 70, for example.

For example, the adhesive 90 is formed to fill a gap between the tubular insulating member 70 and the base plate 20. For example, the adhesive 90 is formed to fill a gap between the outer peripheral surface of the first portion 71 and the inner peripheral surface of the first recess 51. For example, the adhesive 90 is formed to fill a gap between the outer peripheral surface of the second portion 72 and the inner peripheral surfaces of the second recess 52 and the hole portion 53. For example, the adhesive 90 is formed to fill a gap between the tubular insulating member 70 and the adhesive layer 30. For example, the adhesive 90 is formed to fill a gap between the outer peripheral surface of the tubular insulating member 70 and the inner peripheral surface of the through hole 55. For example, the adhesive 90 is formed to fill a gap between the upper surface of the tubular insulating member 70 and the lower surface of the substrate body 41 of the electrostatic chuck 40. With such an adhesive 90, the tubular insulating member 70 is bonded to the inner peripheral surface of the through holes 50, 55, and the tubular insulating member 70 is bonded to the lower surface of the electrostatic chuck 40. Further, the adhesive 90 can eliminate the gap between the base plate 20 and the tubular insulating member 70, the gap between the adhesive layer 30 and the tubular insulating member 70, and the gap between the electrostatic chuck 40 and the tubular insulating member 70.

The adhesive 90 is formed to fill the gap between the power supply terminal 60 and the tubular insulating member 70. The adhesive 90 is formed to fill the gap between the outer peripheral surface of the electrode terminal 61 and the inner peripheral surface of the first hole portion 74. The adhesive 90 is formed to fill the gap between the outer peripheral surface of the coupling member 62 and the inner peripheral surface of the second hole portion 75. The electrode terminal 61 and the coupling member 62 are bonded to the inner peripheral surfaces of the first hole portion 74 and the second hole portion 75 by the adhesive 90. Further, the adhesive 90 can eliminate a gap between the power supply terminal 60 and the tubular insulating member 70.

For example, the adhesive 90 is formed to fill a gap between the electrode terminal 61 and the substrate body 41. For example, the adhesive 90 is formed to fill the recess 43 exposed from the electrode terminal 61 and the bonding member 65. With such an adhesive 90, the electrode terminal 61 can be stably fixed to an inner surface of the recess 43.

As the adhesive 90, for example, an adhesive made of a polymer compound can be used. As the adhesive layer 90, for example, a silicone adhesive can be used.

Manufacturing Method for Substrate Fixing Device 10

Next, a manufacturing method for the substrate fixing device 10 will be described. For convenience of description, the parts that become components of the substrate fixing device 10 will be described with reference numerals of the final components.

Figure 3:
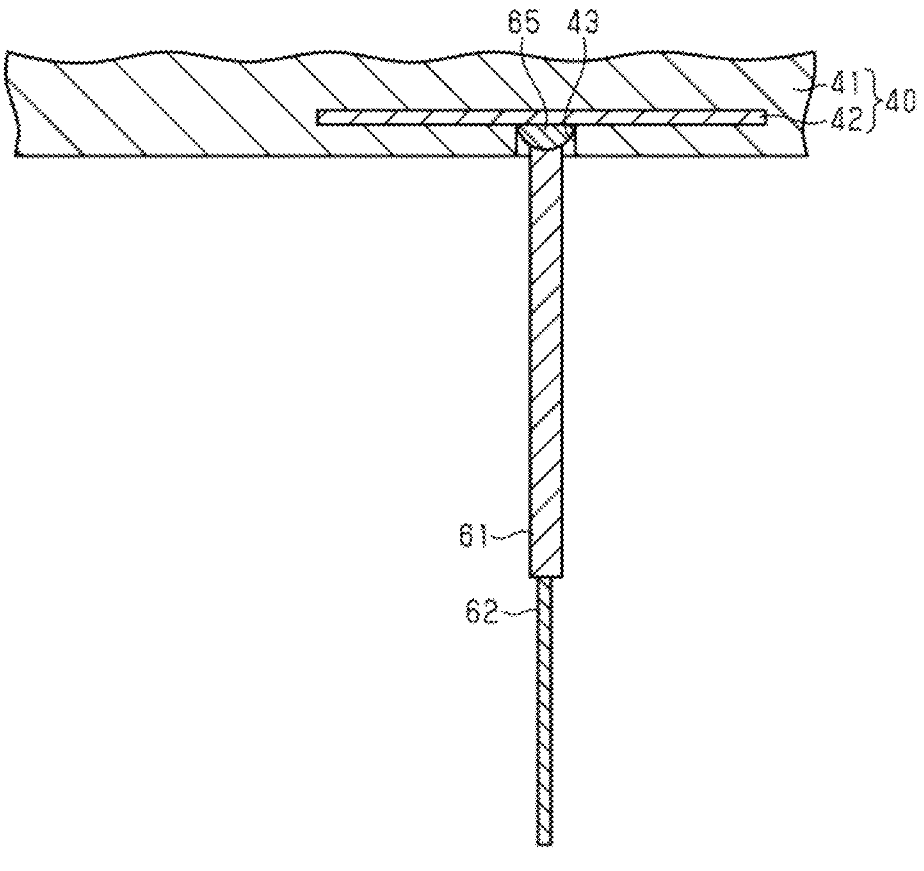
FIG. 3 is a schematic sectional view showing a manufacturing method for the substrate fixing device according to the embodiment.

First, in a process shown in FIG. 3, the electrostatic chuck 40 including the substrate body 41, the electrode 42 built in the substrate body 41, and the recess 43 that exposes a part of the lower surface of the electrode 42 is prepared. In the process shown in FIG. 3, a structure including the electrode terminal 61 and the coupling member 62 rotatably coupled to the lower end portion of the electrode terminal 61 is prepared. Subsequently, the upper end portion of the electrode terminal 61 is bonded to the lower surface of the electrode 42 exposed from the recess 43 by the bonding member 65. At this time, the coupling member 62 linearly extends downward from the lower end portion of the electrode terminal 61, for example.

Figure 4:
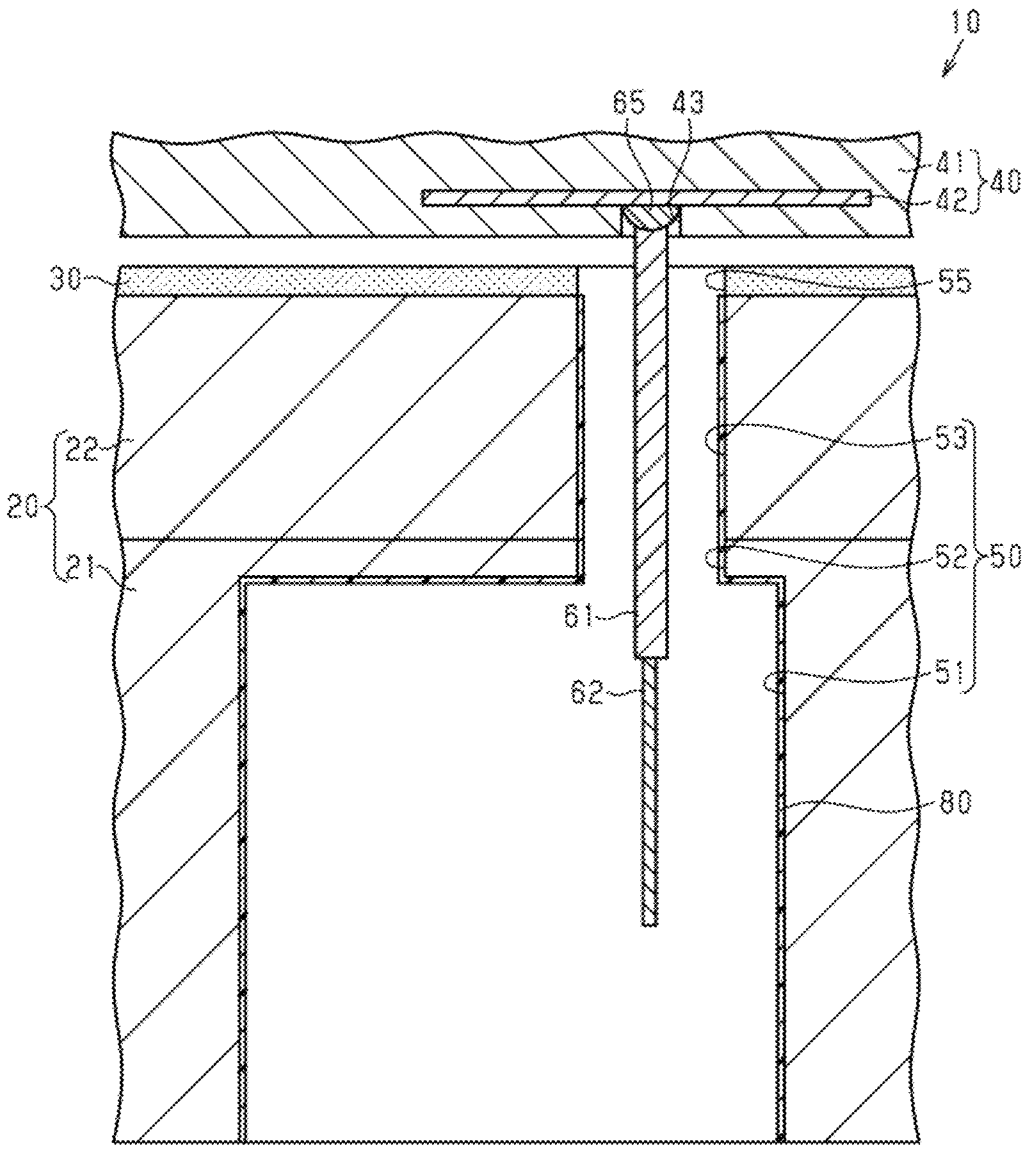
FIG. 4 is a schematic sectional view showing the manufacturing method for the substrate fixing device according to the embodiment.

Next, in a process shown in FIG. 4, the base plate 20 having the lower portion 21, the upper portion 22, and the through hole 50 penetrating the lower portion 21 and the upper portion 22 in the thickness direction is formed, and the adhesive layer 30 having the through hole 55 is formed on the upper surface of the base plate 20. At this time, the insulating film 80 is formed on the inner surface of the through hole 50 as necessary. The insulating film 80 can be formed by, for example, alumite treatment or thermal spraying of aluminum oxide on the inner surface of the through hole 50.

Subsequently, the structure manufactured by the process shown in FIG. 3 is disposed above the structure including the base plate 20 and the adhesive layer 30. At this time, the structures are aligned such that the lower surface of the electrostatic chuck 40 faces the upper surface of the adhesive layer 30 and the electrode terminal 61 and the coupling member 62 can be inserted into the through holes 50, 55.

Figure 5:
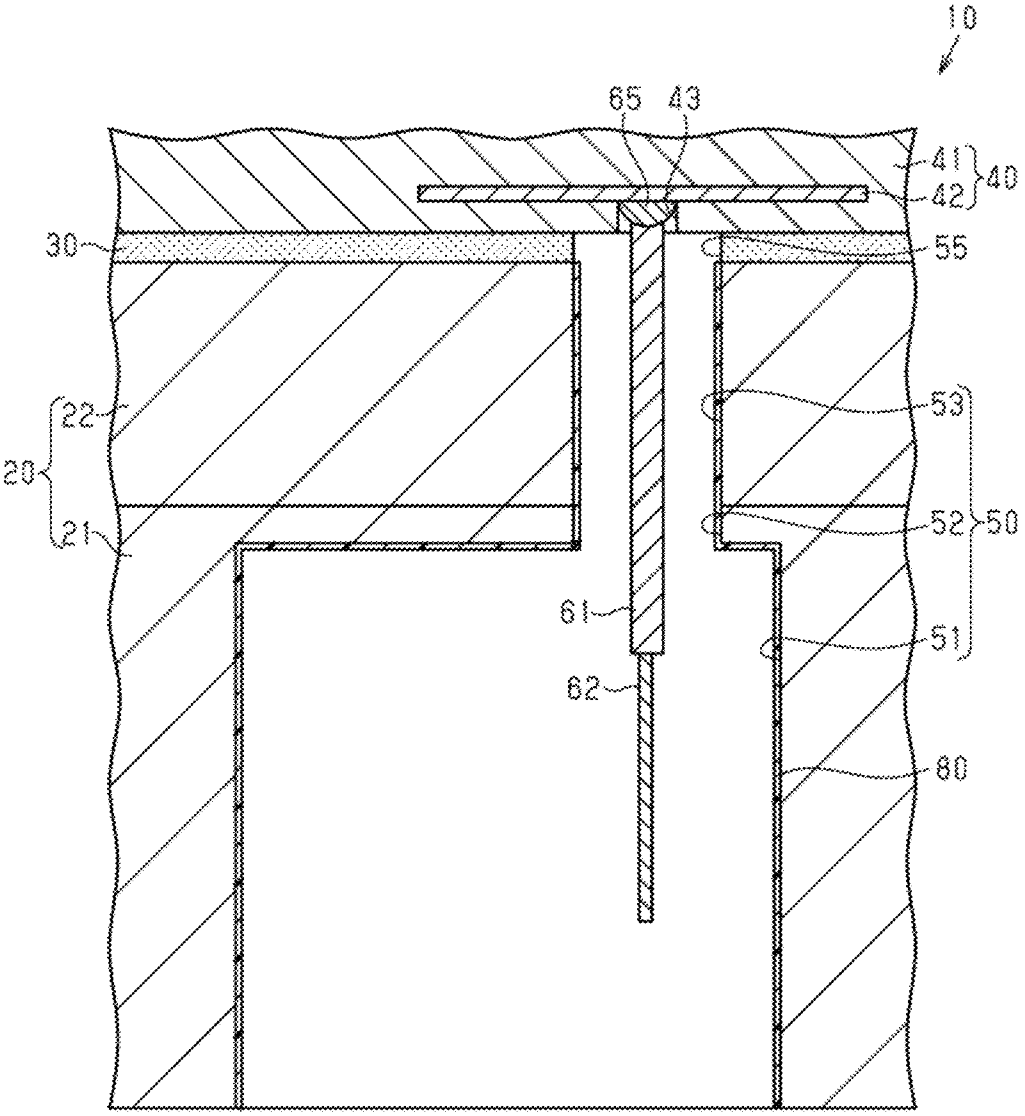
FIG. 5 is a schematic sectional view showing the manufacturing method for the substrate fixing device according to the embodiment.

Next, in a process shown in FIG. 5, the base plate 20 and the electrostatic chuck 40 are bonded by the adhesive layer 30. At this time, the electrode terminal 61 and the coupling member 62 are disposed inside the through holes 50, 55.

Figure 6:
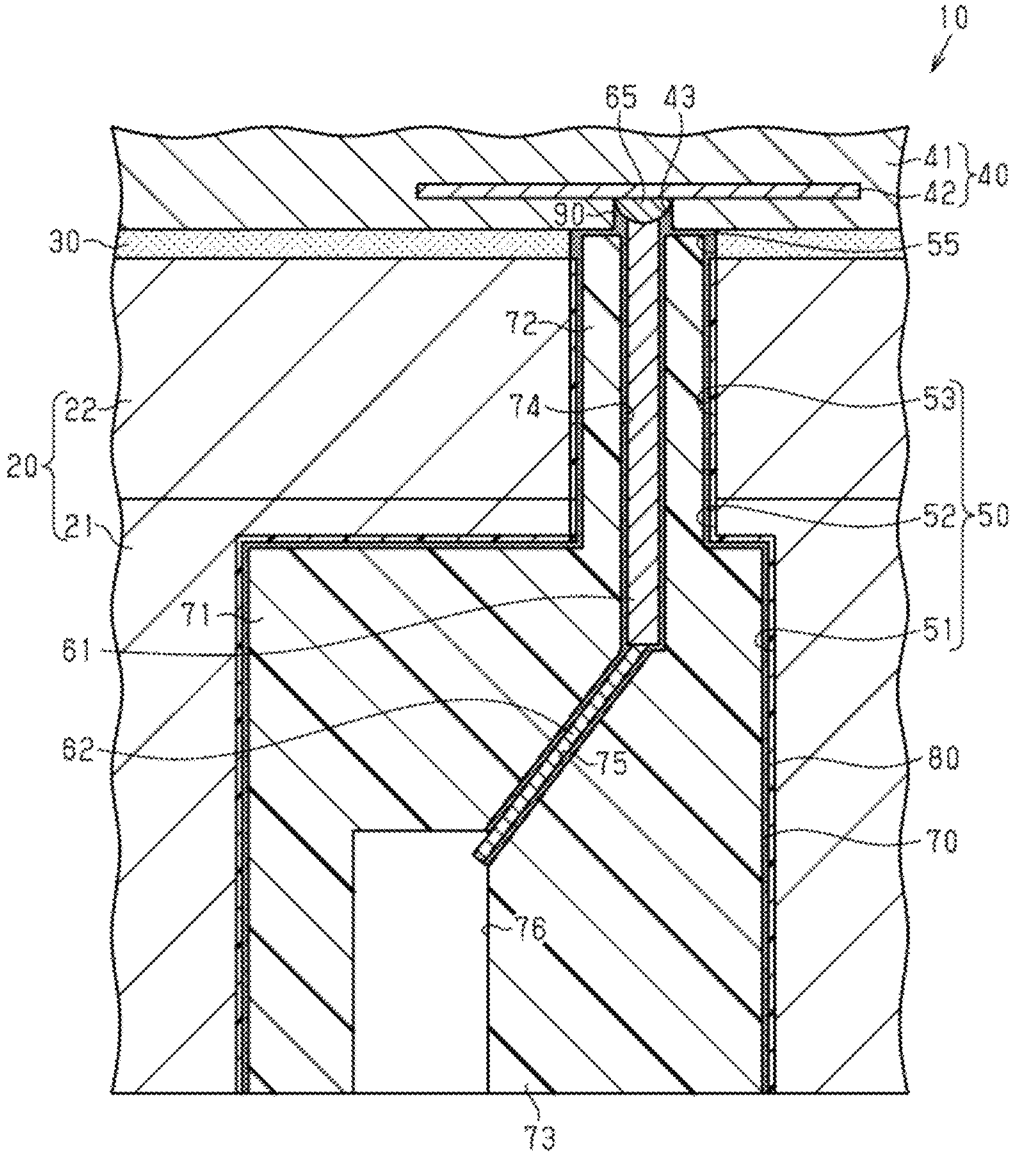
FIG. 6 is a schematic sectional view showing the manufacturing method for the substrate fixing device according to the embodiment.

Subsequently, in a process shown in FIG. 6, the adhesive 90 having fluidity is formed on the inner surfaces of the through holes 50, 55, the lower surface of the substrate body 41 exposed from the through hole 55, and the outer peripheral surfaces of the electrode terminal 61 and the coupling member 62 by coating or the like. The adhesive 90 is formed to fill the recess 43.

Next, the tubular insulating member 70 having the first portion 71, the second portion 72, the first hole portion 74, the second hole portion 75, and the third hole portion 76 is prepared. Subsequently, the tubular insulating member 70 is inserted into the through holes 50, 55 from below the base plate 20. When the tubular insulating member 70 is inserted, first, the coupling member 62 is inserted into the first hole portion 74 of the tubular insulating member 70. As the insertion of the tubular insulating member 70 proceeds, the lower end of the coupling member 62 is inserted into the second hole portion 75 of the tubular insulating member 70. When the tubular insulating member 70 is further inserted, the lower end of the coupling member 62 is guided along the inner peripheral surface of the second hole portion 75, so that the coupling member 62 is rotated with respect to the lower end portion of the electrode terminal 61. Accordingly, the coupling member 62 is formed to extend obliquely downward to the left in the drawing along the second hole portion 75, and the lower end portion of the coupling member 62 is inserted into the third hole portion 76 of the tubular insulating member 70. The tubular insulating member 70 is inserted, for example, until the upper surface thereof abuts against the lower surface of the substrate body 41 (specifically, the adhesive 90 covering the lower surface of the substrate body 41). At this time, the adhesive 90 having fluidity spreads into the gap between the base plate 20 and the tubular insulating member 70, the gap between the electrode terminal 61 and the coupling member 62 and the tubular insulating member 70, and the gap between the substrate body 41 and the tubular insulating member 70.

Next, by performing curing (curing processing) of the adhesive 90, the base plate 20 and the tubular insulating member 70 are bonded, the electrode terminal 61 and the coupling member 62 are bonded to the tubular insulating member 70, and the substrate body 41 and the tubular insulating member 70 are bonded.

Figure 7:
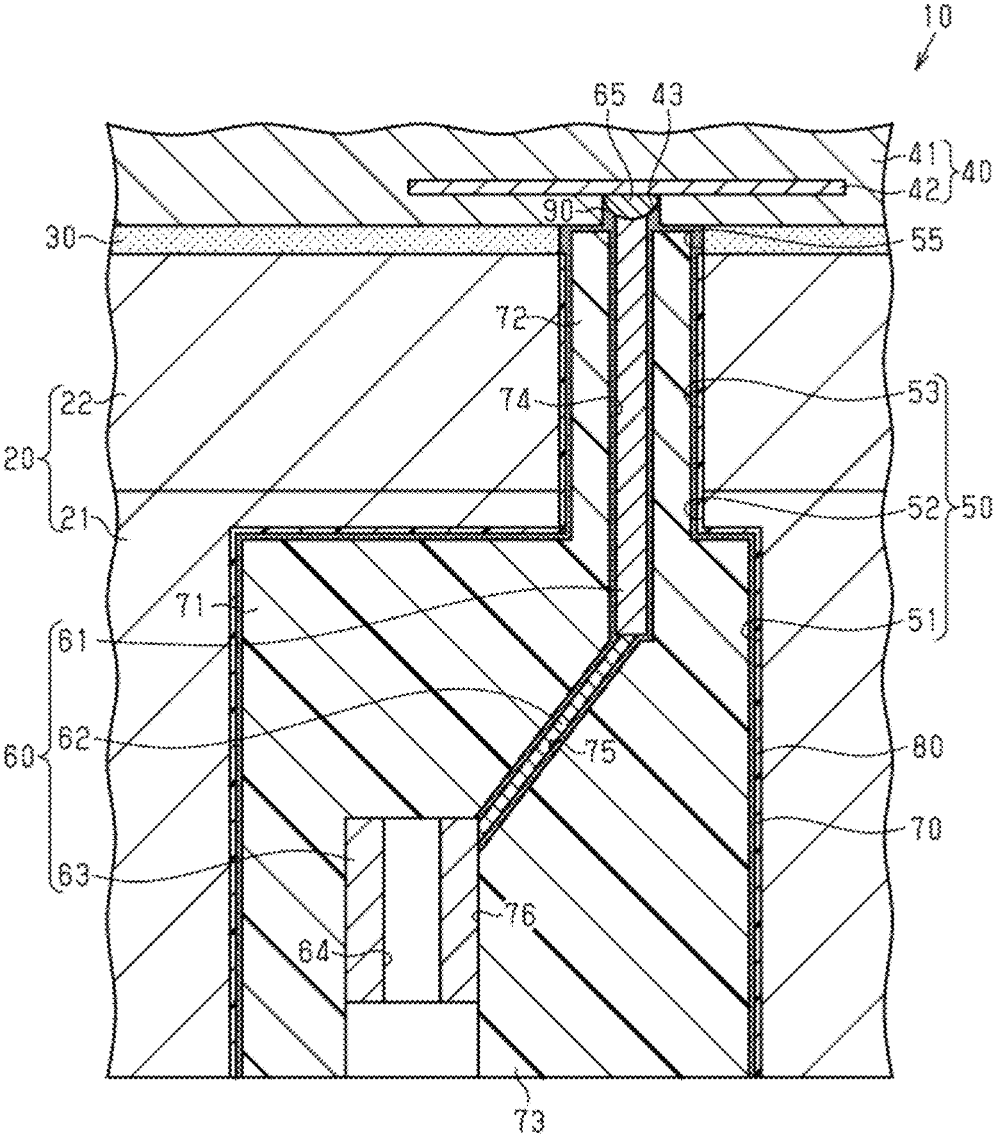
FIG. 7 is a schematic sectional view showing the manufacturing method for the substrate fixing device according to the embodiment.

Subsequently, in a process shown in FIG. 7, the tubular conductive member 63 is inserted into the third hole portion 76 of the tubular insulating member 70. The tubular conductive member 63 is inserted, for example, until the upper surface thereof abuts against a bottom surface of the third hole portion 76. In the present embodiment, the tubular conductive member 63 is screwed into the third hole portion 76 by screwing the screw thread provided on the outer peripheral surface of the tubular conductive member 63 into the screw groove provided on the inner peripheral surface of the third hole portion 76. Then, the tubular conductive member 63 and the coupling member 62 are crimped by a force of screwing the tubular conductive member 63. Accordingly, the power supply terminal 60 in which the electrode terminal 61, the coupling member 62, and the tubular conductive member 63 are electrically connected to each other is formed.

The substrate fixing device 10 according to the present embodiment can be manufactured by the above manufacturing processes.

Operations and Effects According to Present Embodiment

Next, operations and effects according to the present embodiment will be described.

(1) In a substrate fixing device of the related art, a tubular insulating member is formed by combining a plurality of components. In this case, gaps are formed between the plurality of components constituting the tubular insulating member. Such gaps reduces the electrical insulating property. Therefore, a discharge phenomenon may occur between the base plate and the power supply terminal due to the gaps between the plurality of components constituting the tubular insulating member. In particular, when the voltage applied to the electrode becomes a high voltage of 7 kV or more, a problem that the discharge phenomenon occurs between the base plate and the power supply terminal becomes remarkable.

In contrast, in the substrate fixing device 10 according to the present embodiment, the tubular insulating member 70 is formed to surround the entire outer peripheral surface of the portion of the power supply terminal 60 disposed inside the through holes 50, 55 and to extend over the entire length of the through holes 50, 55 in the axial direction. Further, the tubular insulating member 70 is a single member. That is, the tubular insulating member 70 extending over the entire length of the through holes 50, 55 in the axial direction is not a component formed by combining a plurality of components. Therefore, in the tubular insulating member 70, the gaps generated between the plurality of components can be eliminated. Accordingly, the electrical insulating property of the tubular insulating member 70 can be improved as compared with the tubular insulating member of the related art in which a plurality of components are combined. As a result, since the electrical insulating property between the base plate 20 and the power supply terminal 60 can be enhanced, it is possible to suitably prevent the occurrence of the discharge phenomenon between the base plate 20 and the power supply terminal 60. The present inventors confirmed by simulation that the electrical insulating property can be improved by forming the tubular insulating member 70 from a single member.

(2) The tubular insulating member 70 is formed to fill the gap between the outer peripheral surface of the power supply terminal 60 and the inner peripheral surface of the through hole 50. Accordingly, the gap generated between the outer peripheral surface of the power supply terminal 60 and the inner peripheral surface of the through hole 50 can be reduced, and thus it is possible to reduce an area where the electrical insulating property between the outer peripheral surface of the power supply terminal 60 and the inner peripheral surface of the through hole 50 decreases. As a result, it is possible to suitably prevent the occurrence of the discharge phenomenon between the base plate 20 and the power supply terminal 60.

(3) The tubular insulating member 70 includes the protruding portion 73 protruding downward from the lower surface of the power supply terminal 60. According to this configuration, when a connection terminal connected to the power supply for attraction is connected to the lower end portion of the power supply terminal 60, the electrical insulating property between the connection terminal and the base plate 20 can be enhanced by the single tubular insulating member 70.

(4) The insulating film 80 covering the entire inner surface of the through hole 50 is formed. The insulating film 80 can further enhance the electrical insulating property between the base plate 20 and the power supply terminal 60. As a result, it is possible to more suitably prevent the occurrence of the discharge phenomenon between the base plate 20 and the power supply terminal 60.

(5) The adhesive 90 is formed to fill the gap between the insulating film 80 and the tubular insulating member 70 and fill the gap between the power supply terminal 60 and the tubular insulating member 70. According to this configuration, the gap generated between the outer peripheral surface of the power supply terminal 60 and the inner peripheral surface of the through hole 50 can be filled with the adhesive 90. Therefore, it is possible to reduce the area where the electrical insulating property between the outer peripheral surface of the power supply terminal 60 and the inner peripheral surface of the through hole 50 decreases. As a result, it is possible to suitably prevent the occurrence of the discharge phenomenon between the base plate 20 and the power supply terminal 60.

(6) The power supply terminal 60 includes the electrode terminal 61 bonded to the electrode 42, the tubular conductive member 63 provided at a position not overlapping the electrode terminal 61 in a plan view, and the coupling member 62 coupling the electrode terminal 61 and the tubular conductive member 63. The coupling member 62 extends obliquely with respect to the axial direction of the through hole 50. According to this configuration, even when the electrode terminal 61 and the tubular conductive member 63 are provided at positions shifted from each other in a plan view, the electrode terminal 61 and the tubular conductive member 63 can be electrically connected by the coupling member 62.

(7) The tubular insulating member 70 includes the first hole portion 74 into which the electrode terminal 61 is inserted, the second hole portion 75 into which the coupling member 62 is inserted and which communicates with the first hole portion 74, and the third hole portion 76 into which the tubular conductive member 63 is inserted and which communicates with the second hole portion 75. The second hole portion 75 extends obliquely with respect to the axial direction of the through hole 50. The coupling member 62 is coupled to the lower end portion of the electrode terminal 61 to be rotatable with respect to the electrode terminal 61.

According to this configuration, the coupling member 62 is rotatably coupled to the electrode terminal 61. Therefore, when the tubular insulating member 70 is attached to the outer periphery of the power supply terminal 60, the coupling member 62 is guided by the inner peripheral surface of the second hole portion 75 extending obliquely with respect to the axial direction of the through hole 50, so that the coupling member 62 can be suitably inserted into the second hole portion 75.

Modifications

The above embodiment may be modified as follows. The above embodiment and the following modifications can be combined as long as there is no technical contradiction.

The structure of the power supply terminal 60 in the above embodiment can be changed as appropriate.

Figure 8:
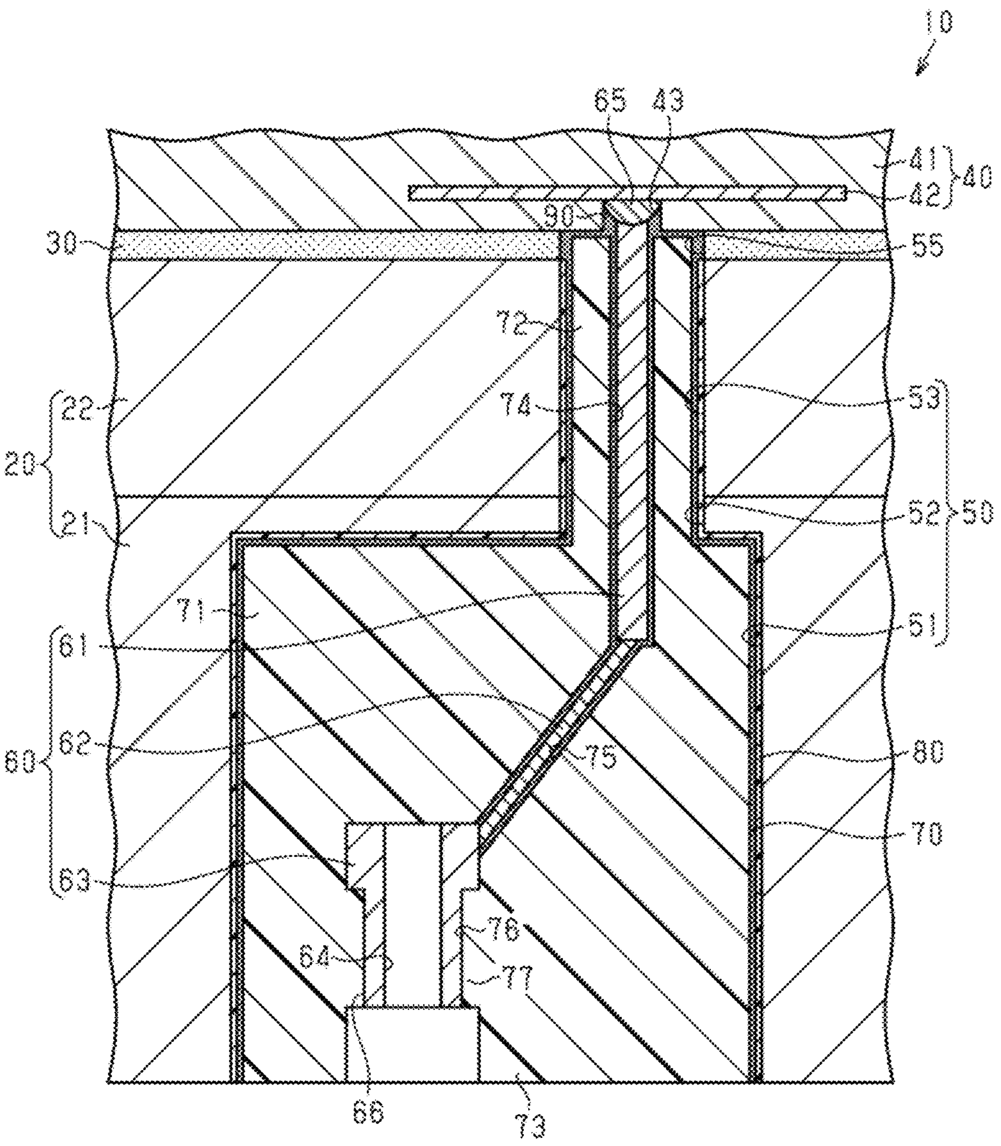
FIG. 8 is an enlarged schematic sectional view showing a part of a substrate fixing device according to a modification.

For example, as shown in FIG. 8, a recessed portion 66 may be provided on the outer peripheral surface of the tubular conductive member 63. The recessed portion 66 is formed to be recessed inward in a radial direction of the tubular conductive member 63 from the outer peripheral surface of the tubular conductive member 63. The recessed portion 66 extends upward from the lower surface of the tubular conductive member 63, for example. The recessed portion 66 according to the present modification is formed by cutting out the lower end portion of the tubular conductive member 63. In the present modification, the tubular insulating member 70 includes a filling portion 77 formed to fill the recessed portion 66. The filling portion 77 is formed to fill an internal space of the recessed portion 66.

According to this configuration, by providing the recessed portion 66 on the outer peripheral surface of the tubular conductive member 63, a distance between the tubular conductive member 63 and the base plate 20 can be increased. Further, by providing the filling portion 77 formed to fill the recessed portion 66 in the tubular insulating member 70, the electrical insulating property between the tubular conductive member 63 and the base plate 20 can be suitably improved. Accordingly, it is possible to suitably prevent the occurrence of the discharge phenomenon between the base plate 20 and the tubular conductive member 63.

Figure 9:
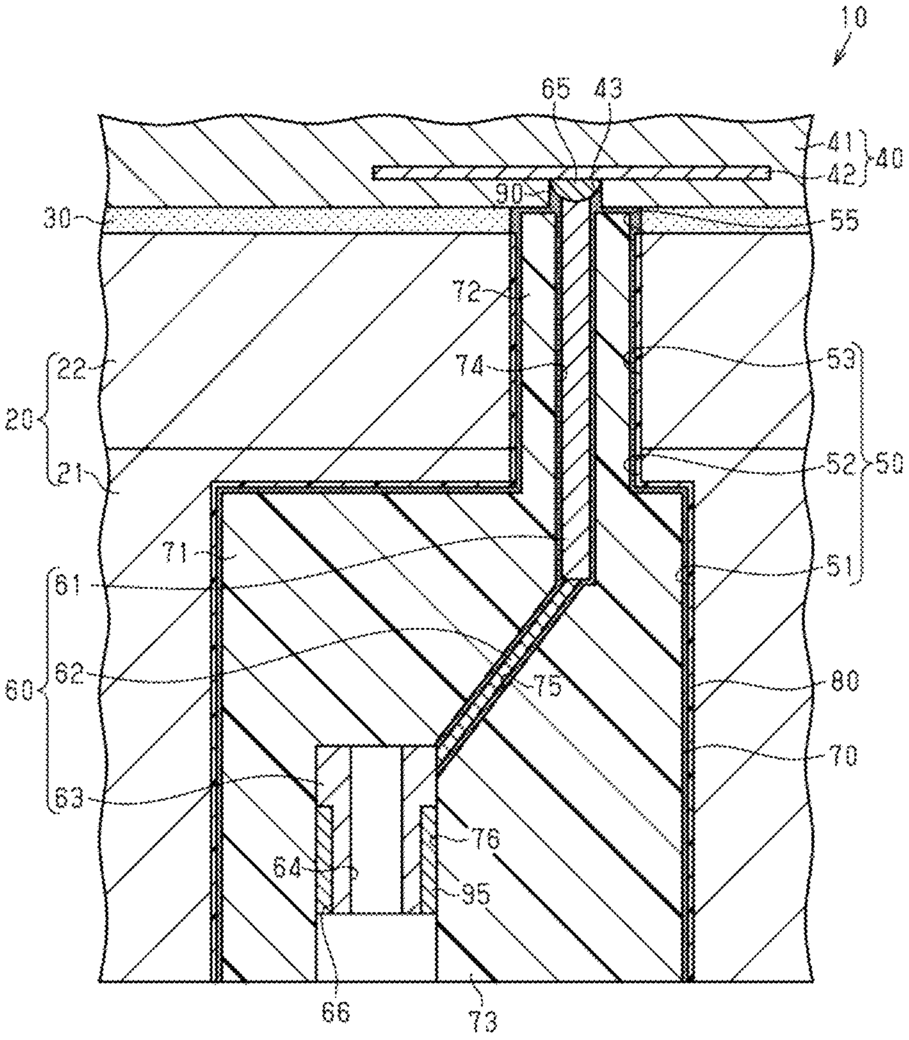
FIG. 9 is an enlarged schematic sectional view showing a part of a substrate fixing device according to a modification.

For example, as shown in FIG. 9, an insulating layer 95 may be provided in the recessed portion 66. The insulating layer 95 is formed to fill the recessed portion 66. That is, the insulating layer 95 is formed to fill the internal space of the recessed portion 66. The insulating layer 95 is a separate member from the tubular insulating member 70. For example, an aluminum oxide film can be used as the insulating layer 95. The insulating layer 95 can be formed by, for example, thermal spraying of aluminum oxide to the recessed portion 66.

According to this configuration, it is possible to obtain the same operations and effects as those of the modification example shown in FIG. 8.

In the modifications shown in FIGS. 8 and 9, the recessed portion 66 is provided on the outer peripheral surface of the tubular conductive member 63, but the present invention is not limited thereto. For example, the recessed portion 66 may be provided on the outer peripheral surface of the electrode terminal 61. For example, the recessed portion 66 may be provided on the outer peripheral surface of the coupling member 62.

The power supply terminal 60 according to the above embodiment is formed by combining a plurality of conductive components, that is, the electrode terminal 61, the coupling member 62, and the tubular conductive member 63, but is not limited thereto. For example, the power supply terminal 60 may be formed with only a single conductive component. For example, the power supply terminal 60 may include only the electrode terminal 61. For example, the power supply terminal 60 may include only the tubular conductive member 63. In these cases, for example, the power supply terminal 60 is formed to extend linearly along one direction (for example, a direction parallel to the axial direction of the through hole 50). Therefore, the shape of the through holes 50, 55 is changed in accordance with the shape of the power supply terminal 60, and the shape of the tubular insulating member 70 is changed in accordance with the shape of the power supply terminal 60.

In the above embodiment, the lower surface of the power supply terminal 60, specifically, the lower surface of the tubular conductive member 63 is provided above the lower surface of the base plate 20, but the present invention is not limited thereto. For example, the power supply terminal 60 may extend to the lower surface of the base plate 20. In other words, the lower surface of the power supply terminal 60 may be provided on the same plane as the lower surface of the base plate 20.

In the above embodiment, the power supply terminal 60 is bonded to the electrode 42 by the bonding member 65, but the present invention is not limited thereto. For example, the power supply terminal 60 may be changed to one that comes into contact with the lower surface of the electrode 42 exposed from the recess 43 by an elastic force. In this case, the power supply terminal 60 and the electrode 42 are brought into contact with each other by the elastic force, whereby the power supply terminal 60 and the electrode 42 are electrically connected to each other.

In the above embodiment, the tubular insulating member 70 manufactured separately from the base plate 20 and the like is inserted into the through holes 50, 55 of the base plate 20, but the present invention is not limited thereto. For example, the tubular insulating member 70 may be formed by pouring a resin having fluidity into the through holes 50, 55 and curing the resin in a state where the power supply terminal 60 including the electrode terminal 61, the coupling member 62, and the tubular conductive member 63 is disposed inside the through holes 50, 55. In this case, the adhesive 90 can be omitted.

The insulating film 80 in the above embodiment may be formed to cover the inner surface of the through hole 55 provided in the adhesive layer 30.

The insulating film 80 in the above embodiment may be omitted.

The substrate fixing device 10 in the above embodiment is applied to a semiconductor manufacturing device, for example, a dry etching device. Examples of the dry etching device include a parallel plate type reactive ion etching device. The substrate fixing device 10 can also be applied to a semiconductor manufacturing device such as a plasma chemical vapor deposition (CVD) device or a sputtering device.

What is claimed is:

1. A substrate fixing device comprising:

a base plate;

an electrostatic chuck fixed on the base plate;

a first through hole penetrating the base plate from an upper surface to a bottom surface in a thickness direction;

a recess provided in a lower surface of the electrostatic chuck and communicating with the first through hole;

an electrode built in the electrostatic chuck;

a power supply terminal inserted into the first through hole and electrically connected to the electrode exposed from the recess; and a tubular insulating member inserted into the first through hole and surrounding an outer periphery of the power supply terminal, wherein the tubular insulating member is formed to surround an entire outer peripheral surface of a portion of the power supply terminal disposed inside the first through hole, the tubular insulating member is formed to extend over an entire length of the first through hole in an axial direction, so that the tubular insulating member extends from the upper surface of the base plate to the bottom surface of the base plate, the tubular insulating member is a single member, a bottom surface of the power supply terminal is provided above the bottom surface of the base plate, the tubular insulating member includes a protruding portion protruding downward from the bottom surface of the power supply terminal, the power supply terminal includes:

an electrode terminal bonded to the electrode;

a tubular conductive member provided at a position not overlapping the electrode terminal in a plan view; and a coupling member coupling the electrode terminal and the tubular conductive member, the coupling member extends obliquely with respect to the axial direction of the first through hole, the tubular insulating member includes:

a first hole portion into which the electrode terminal is inserted;

a second hole portion into which the coupling member is inserted and which communicates with the first hole portion; and a third hole portion into which the tubular conductive member is inserted and which communicates with the second hole portion, the second hole portion extends obliquely with respect to the axial direction of the first through hole, and the coupling member is coupled to a lower end portion of the electrode terminal to be rotatable with respect to the electrode terminal.

2. The substrate fixing device according to claim 1, wherein the tubular insulating member is formed to fill a gap between the entire outer peripheral surface of the portion of the power supply terminal and an inner peripheral surface of the first through hole.

3. The substrate fixing device according to claim 1, further comprising an insulating film covering an entire inner surface of the first through hole.

4. The substrate fixing device according to claim 3, further comprising an adhesive bonding the base plate and the tubular insulating member, wherein the adhesive is formed to fill a gap between the insulating film and the tubular insulating member and to fill a gap between the power supply terminal and the tubular insulating member.

5. The substrate fixing device according to claim 1, further comprising an adhesive layer bonding the base plate and the electrostatic chuck; and a second through hole penetrating the adhesive layer in a thickness direction, wherein the second through hole is formed to communicate with the first through hole and to communicate with the recess, the power supply terminal is inserted into the second through hole, the tubular insulating member is inserted into the second through hole and is formed to surround an entire outer peripheral surface of a portion of the power supply terminal disposed inside the second through hole, and the tubular insulating member is formed to extend over an entire length of the second through hole in the axial direction.

6. The substrate fixing device according to claim 1, further comprising a recessed portion provided on an outer peripheral surface of the power supply terminal, wherein the tubular insulating member includes a filling portion formed to fill the recessed portion.

7. The substrate fixing device according to claim 1, further comprising:

a recessed portion provided on an outer peripheral surface of the power supply terminal; and an insulating layer formed to fill the recessed portion, wherein the insulating layer is a separate member from the tubular insulating member.

* * * * *